(12) United States Patent
Li

(10) Patent No.: US 12,519,437 B2
(45) Date of Patent: Jan. 6, 2026

(54) LOGIC OPERATION CIRCUIT, DIFFERENTIAL AMPLIFIER CIRCUIT, AND ELECTRONIC DEVICE

(71) Applicant: Shijie Li, Shanghai (CN)

(72) Inventor: Shijie Li, Shanghai (CN)

( * ) Notice: Subject to any disclaimer, the term of this patent is extended or adjusted under 35 U.S.C. 154(b) by 0 days.

(21) Appl. No.: 18/527,506

(22) Filed: Dec. 4, 2023

(65) Prior Publication Data
US 2024/0106399 A1 Mar. 28, 2024

Related U.S. Application Data

(63) Continuation of application No. PCT/CN2021/108500, filed on Jul. 26, 2021.

(30) Foreign Application Priority Data

Jun. 8, 2021 (CN) .......................... 202110640251.6

(51) Int. Cl.
H03F 3/45 (2006.01)
H03F 1/02 (2006.01)
H03K 19/096 (2006.01)

(52) U.S. Cl.
CPC ....... *H03F 3/45264* (2013.01); *H03F 1/0216* (2013.01); *H03F 3/45183* (2013.01); *H03F 3/45273* (2013.01); *H03K 19/0963* (2013.01); *H03F 2200/261* (2013.01)

(58) Field of Classification Search
CPC .............. H03F 3/45264; H03F 1/0216; H03F 3/45183; H03F 3/45273; H03F 2200/261; H03F 2203/45141; H03F 1/0266; H03F 3/45197; H03K 19/0963; H03K 3/356139; H03K 19/00315; H03K 19/018507; H03K 19/018528; H03K 19/215; H03K 19/20; H03K 19/0013; H03K 19/00338; H03K 19/00384; H04L 9/002

See application file for complete search history.

(56) References Cited

U.S. PATENT DOCUMENTS

2007/0008014 A1* 1/2007 Parris .................. H03K 19/215
326/121

FOREIGN PATENT DOCUMENTS

| CN | 101924553 A | | 12/2010 |
| CN | 206237376 U | * | 6/2017 |
| CN | 107767907 A | | 3/2018 |
| CN | 110113054 A | | 8/2019 |

* cited by examiner

*Primary Examiner* — Jung Kim
(74) *Attorney, Agent, or Firm* — Zhigang Ma

(57) ABSTRACT

A logic operation circuit, includes at least one differential logic operation circuit, the differential logic operation circuit includes a logic network module, a differential amplifier module, and a differential amplifier module. The logic network module includes a first logic network unit and a second logic network unit with functions complementarity to each other. A differential signal is generated based on input signals of the first logic network unit and the second logic network unit, the first logic network and the second logic network performs a predetermined logic function to output an operation result based on the input signals. The differential amplifier module, includes a first input terminal, a second input terminal, a first output terminal, a second output terminal, the first input terminal and the second input terminal are connected to an output of the first logic network and the second logic network respectively.

11 Claims, 7 Drawing Sheets

LOGIC OPERATION CIRCUIT, DIFFERENTIAL AMPLIFIER CIRCUIT, AND ELECTRONIC DEVICE

CROSS REFERENCE TO RELATED APPLICATION

This application is a Continuation of PCT Patent Application No. PCT/CN2021/108500 filed on Jul. 26, 2021, which claims priority of China Patent Application No. 202110640251.6, filed on Jun. 8, 2021. The contents of the above-identified applications are incorporated herein by reference.

TECHNICAL FIELD

The disclosure relates to the field of integrated circuits, and in particular to a logic operation circuit, a differential amplifier circuit, and an electronic device.

BACKGROUND

In recent years, with the rapid development of integrated circuits, the security issues caused by vulnerabilities in integrated circuits have become increasingly significant. Edge channel attacks, also known as side-channel attacks, the core idea of the side-channel attacks is to analyze plaintext and key information by obtaining various leaked information generated during hardware operation. During hardware operation, there generates various leakage data mainly including variables such as power consumption, electromagnetic radiation, and temperature based on internal electrical level fluctuations within the chip. By analyzing these variables, data information inside the chip can be captured. With the development of mobile payments, more and more sensitive data is built on substrate chips. Although these sensitive data have been protected using encryption algorithms, the attackers can still perform edge channel analysis on the chip to obtain internal plaintext, keys, and other information. In addition, the side-channel attacks can also bring significant security risks to various electronic devices, especially AES (Advanced Encryption Standard) cryptographic devices.

In existing technology, a individual signal line is used for signal transmission, and the signal changes between 0/1, that the transmitted voltage on the signal line switches between high and low electrical levels. The changes of the level requires absorbing or releasing a large amount of charge, resulting in different physical data such as circuit power consumption, electromagnetic radiations, or temperatures. By analyzing these features, data information inside the chip can be obtained and susceptible to side-channel attacks.

SUMMARY

The present disclosure provided a logic operation circuit, a differential amplifier circuit, and an electronic device which can solve problems of side-channel attacks when using existing individual signal lines for signal transmission.

In a first aspect, a logic operation circuit provided includes at least one differential logic operation circuit, the differential logic operation circuit includes a logic network module, a differential amplifier module, and a differential amplifier module. The logic network module includes a first logic network unit and a second logic network unit with functions complementarity to each other. A differential signal is generated based on input signals of the first logic network unit and the second logic network unit, the first logic network and the second logic network performs a predetermined logic function to output an operation result based on the input signals. The differential amplifier module, includes a first input terminal, a second input terminal, a first output terminal, a second output terminal, the first input terminal and the second input terminal are connected to an output of the first logic network and the second logic network respectively; the first output terminal and the second output terminal forms a differential output terminal to amplify the operation result to obtain and output a logic operation result.

In a second aspect, a differential amplifier circuit provided includes at least one differential module, the at least one differential module includes a sub storage module, a sub differential amplifier module, a sub pre-charging unit, a sub current source unit, The sub storage module with a differential input terminal is configured to receive and store input differential signals. The sub storage module with a differential input terminal is configured to receive and store input differential signals. The sub differential amplifier module with a differential output terminal connected with the sub storage module is configured to output differential results based on the input differential signals. The sub pre-charging unit, is connected to the sub differential amplifier module, and is configured to pre-charge the sub differential amplifier module for controlling a voltage of the differential output terminal to be a supply voltage in a pre-charging unit. The sub current source unit, is connected to the sub differential amplifier module, and is configured to establish a current path for the sub differential amplifier module during an evaluation period.'

In a third aspect, an electronic device provided includes a logic operation circuit, the logic operation circuit includes at least one differential logic operation circuit. The at least one differential logic operation circuit includes a logic network module, a differential amplifier module, and a differential amplifier module. The logic network module includes a first logic network unit and a second logic network unit with functions complementarity to each other; a differential signal generated based on input signals of the first logic network unit and the second logic network unit, the first logic network and the second logic network performs a predetermined logic function to output an operation result based on the input signals. The differential amplifier module includes a first input terminal, a second input terminal, and a first output terminal, and a second output terminal, the first input terminal and the second input terminal are connected to an output of the first logic network and the second logic network respectively; the first output terminal and the second output terminal forming a differential output terminal to amplify the operation result to obtain and output a logic operation result.

The logic operation circuit of the present invention comprises at least one differential logic operation circuit, wherein the differential logic operation circuit comprises: a logic network module and a differential amplifier module, wherein the logic network module comprises a first logic network unit and a second logic network unit with complementary logic functions. The input signals of the first logic network unit and the second logic network unit form a differential signal, and various preset logic functions can be achieved through the logic network module. Due to the weak output signal of the logic network module, the output result of the logic network module needs to be connected to a differential amplifier module for signal amplification and output the differential form of operation results. As the logic network module uses differential signals for signal transmission, the differential signal adopts positive and negative voltage differences between levels. To represent 0 and 1, the amplitude of the level change is small, which makes changes of physical data such as circuit power consumption, electromagnetic radiation, or temperature be not obvious. That is, regardless of whether the transmitted information is 0 or 1, the physical quantities that can be captured by the outside world are the same, making it difficult to obtain internal data information of the chip and preventing side-channel attacks, Improved data security. In addition, the use of logic network modules can achieve various logic functions, improving the logical complexity of the circuit. Due to the fact that logic network modules can use lower power supply voltages, the power consumption of the circuit is reduced; In addition, compared to using discrete devices to achieve logic functions, using dedicated logic network modules can reduce the number of components and optimize the chip area.

BRIEF DESCRIPTION OF THE DRAWINGS

In order to provide a clearer explanation of the technical solution in the embodiments of this disclosure, a brief introduction will be made to the accompanying drawings required in the description of the embodiments. It is evident that the accompanying drawings are only some embodiments of this disclosure. For those skilled in the art, other accompanying drawings can be obtained based on these drawings without creative labor.

DETAILED DESCRIPTION OF THE EMBODIMENTS

The following, combined with the accompanying drawings, provides a clear and complete description of the technical solution in the embodiments of this application. Obviously, the described embodiments are only a part of the embodiments of this application, not all of them. Based on the embodiments in this application, all other embodiments obtained by those skilled in the art without creative labor fall within the scope of protection in this application. Without conflict, the following embodiments and their technical features can be combined with each other.

Figure 1:
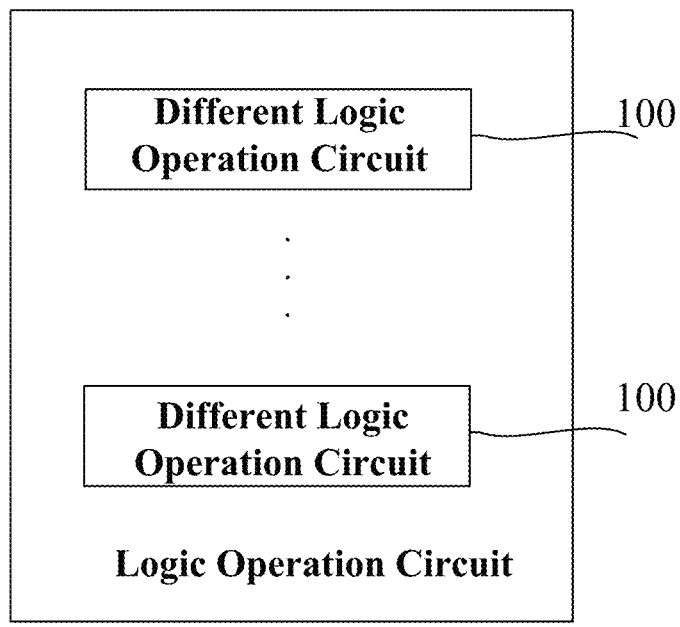
FIG. 1 is a schematic diagram of a structure of a logic operation circuit in an embodiment of the present invention.
Figure 2:
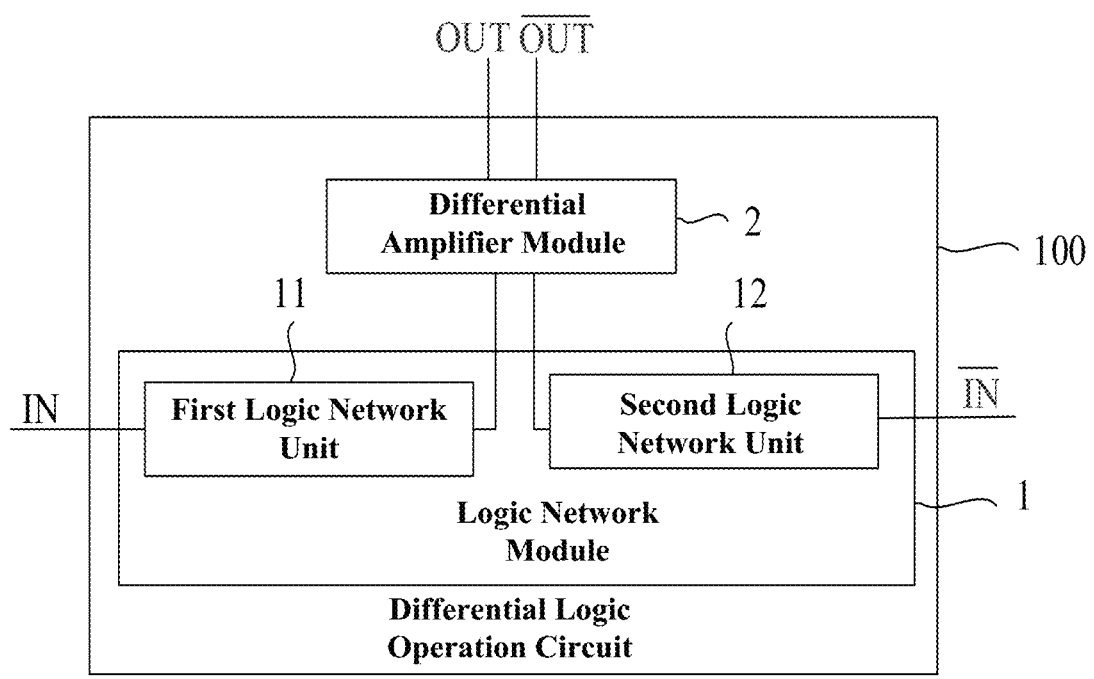
FIG. 2 is a schematic diagram of a structure of a differential logic operation circuit in an embodiment of the present invention.

Referring to FIG. 1, a schematic function module diagram of a logic operation circuit.

a logic operation circuit 200 includes at least one differential logic operation circuit 100. As shown in FIG. 2, the differential logic operation circuit 100 includes a logic network module 1 and a differential amplifier module 2.

The logic network module 1 includes a first logic network unit 11 and a second logic network unit 12 with functions complementarity to each other. An input signals IN of the first logic network unit 11 and an input signal $\overline{IN}$ of the second logic network unit 12 form a differential signal. A combination of transistors is applied as internal structures of the first logic network unit 11 and the second logic network unit 12, and different combinations of the transistors can be used to achieve different logic functions, such as "XOR" calculation, "AND not" calculation, "1-bit full" adder, "1-bit half" adder, or any other logic calculations capable of achieving different preset logic functions. The first logic network unit 11 and the second logic network unit 12 are located on both sides of the differential amplifier module 2. The circuit connection method is different from the Dynamic Current Mode Logic (DYCML) circuit with a logic circuit inside a charging and discharging unit, which can increase the complexity of the circuit.

The differential amplifier module 2 includes a first input terminal, a second input terminal, a first output terminal OUT, and a second output terminal $\overline{OUT}$. The first input terminal of differential amplifier module 2 and the second input terminal of differential amplifier module 2 are respectively connected to the output terminals of the first logic network unit 11 and the second logic network unit 12. The first output terminal OUT and the second output terminal $\overline{OUT}$ constitute the differential output terminal, Differential amplifier module 2 is used to amplify the output operation results of the first logic network unit 11 and the second logic network unit 12, and output the operation results of the logic operation circuit 200.

Figure 3:
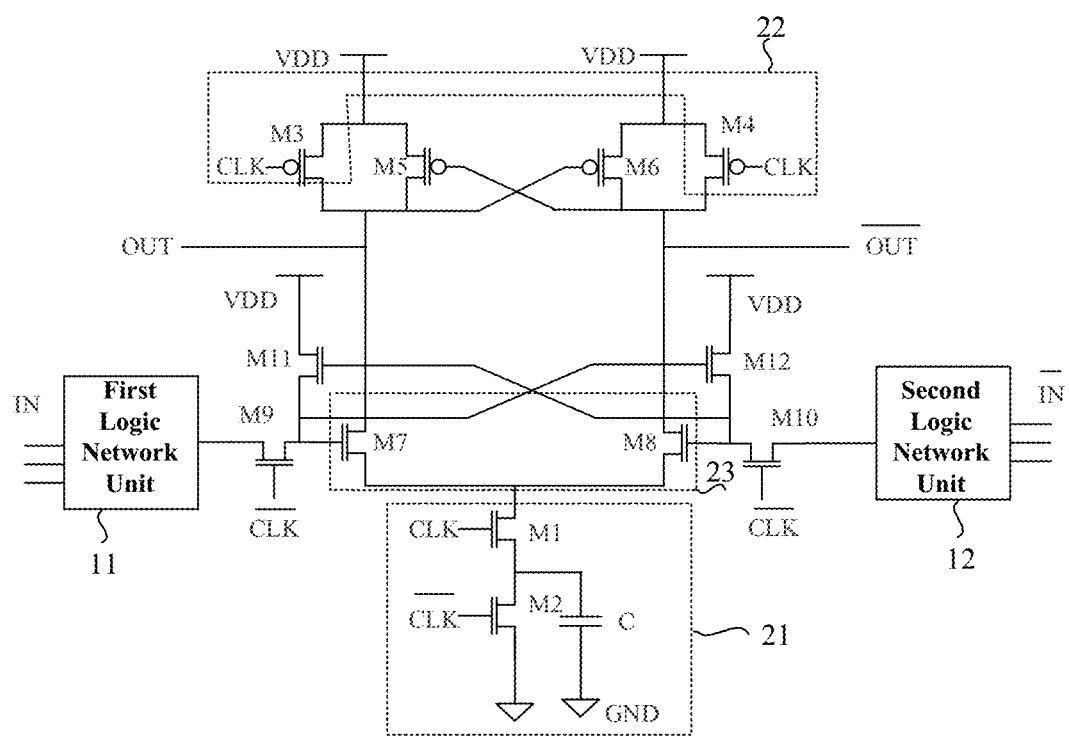
FIG. 3 is a schematic diagram of a circuit structure of a logic operation circuit in an embodiment of the present invention.

Referring to FIG. 3, a schematic circuit diagram of the logic operation circuit. The differential amplifier module 2 includes a current source unit 21, a pre-charging unit 22, and a differential amplification unit 23. The differential amplification unit 23 is connected to the output terminals of the first logic network unit 11 and the second logic network unit 12 to amplify the operation result and outputting an amplifier operation result. The pre-charging unit 22 is connected to the differential amplification unit 23, to pre charge the differential amplification unit 23 for controlling voltage of the first output terminal OUT and the second output terminal $\overline{OUT}$ to be a power supply voltage VDD during a pre-charging period. The current source unit 21 is connected to the differential amplification unit 23 to establish a current path for the differential amplification unit 23 during an evaluation period. Specifically, the current source unit 21 includes a transistor M1, a transistor M2, and a capacitor C form the current source unit 21. The transistor M1 and the transistor M2 are N-channel MOSFETs, with a gate terminal of transistor M1 connected to a clock signal CLK, a source terminal connected to a drain terminal of the transistor M2 and one end of capacitor C, a gate terminal of the transistor M2 connected to the clock signal, and the phase of the clock signal is opposite to that of CLK. A source terminal of the transistor M2 and the other end of capacitor C are grounded, connected to GND. The pre-charging unit 22 includes a transistor M3 and a transistor M4. The transistor M3 and the transistor M4 are P-channel MOSFETs, and the clock signal CLK is input to the gate of transistor M3. The source of transistor M3 is connected to the power supply voltage VDD, and the drain is connected to the first output terminal OUT; the clock signal CLK is input to the gate of transistor M4. The source of transistor M4 is connected to the power supply voltage VDD, and the drain is connected to the second output terminal. The pre-charging unit 22 is used to control the output voltage VDD of the first output terminal OUT and the second output terminal during the pre-charging period. Transistor M7 and transistor M8 form a differential amplification unit 23, which is used to amplify the operation results output by the first logic network unit 11 and the second logic network unit 12, and output the logic operation results. Transistor M7 and transistor M8 are N-channel MOSFETs. A gate terminal of the transistor M7 is connected to the output terminal of the first logic network unit 11, a drain terminal of the transistor M7 is connected to the drain of transistor M3, a source terminal of the transistor M7 is connected to the drain of the transistor M1, a gate terminal of the transistor M8 is connected to the output terminal of the second logic network unit 12, a drain terminal of the transistor M8 is connected to the drain terminal of transistor M4, and a source terminal of the transistor M8 is connected to the drain of the transistor M1. At the same time, the transistor M7 and transistor M8 also form a PDN (pull-down network) for transmitting and amplifying the voltage at the first output terminal OUT and the second output terminal $\overline{\text{OUT}}$.

The logic operation circuit in above embodiments includes at least one differential logic operation circuit, the differential logic operation circuit include the logic network module and the differential amplifier module, the logic network module includes the first logic network unit and a second logic network unit with logic functions complementary to each other, and the input signals of the first logic network unit and the second logic network unit form a differential signal, The various preset logic functions can be achieved through the logic network module. Due to the weak output signal of the logic network module, it is necessary to transmit the output result of the logic network module to the differential amplifier module for amplifying, and the differential operation results can be strong enough. As the logic network module uses differential signals for signal transmission, the differential signal uses value 0 and 1 to present difference between positive and negative voltages of the electrical levels that a small amplitude changes of the electric level makes an inconspicuous changes of the physical data, such as, circuit power consumption, electromagnetic radiations, or temperatures, that further makes it difficult to obtain internal data information of the chip. Therefore, it prevents side-channel attacks and improves data security. In addition, compared to existing technologies that use circuits to implement simple logic functions inside differential circuits, the differential logic operation circuit sets the logic network module outside the differential amplifier module, separates various complex logic function logic network modules separately, and connects the various complex logic function logic network modules to the differential input of the differential amplifier module to achieve the logic function of the logic network module, which can perform more complex logical operations. Due to a common source and common gate structure composed of the internal logic operation network and PDN in typical differential circuits requiring higher power supply voltage to operate, the power consumption of the circuit is increased. However, in this embodiment, the logic network modules and differential amplifier module are separated, and the logic network module uses a voltage swing lower than the power supply voltage to reduce the power consumption of the circuit.

The calculation results of the logic network module in the logic operation circuit in the above embodiments are directly output and are not stored. Due to the requirement of storing intermediate information in the logic operation circuit to form a pipeline for improving computing power, in order to solve the problem of information storage, the differential amplification module 2 further includes a storage unit, which is connected to the output terminals of the first logic network unit 11 and the second logic network unit 12 for information storage. In order to further minimize the channel charge injection effect, improve circuit speed, and reduce circuit power consumption, the differential amplification module 2 further includes an absorption unit, which is connected to the storage unit to absorb excess charges generated by the storage unit during switch switching. In order to stabilize the differential voltage output of the logic operation circuit, the differential amplification module 2 of further includes a latch unit.

Figure 4:
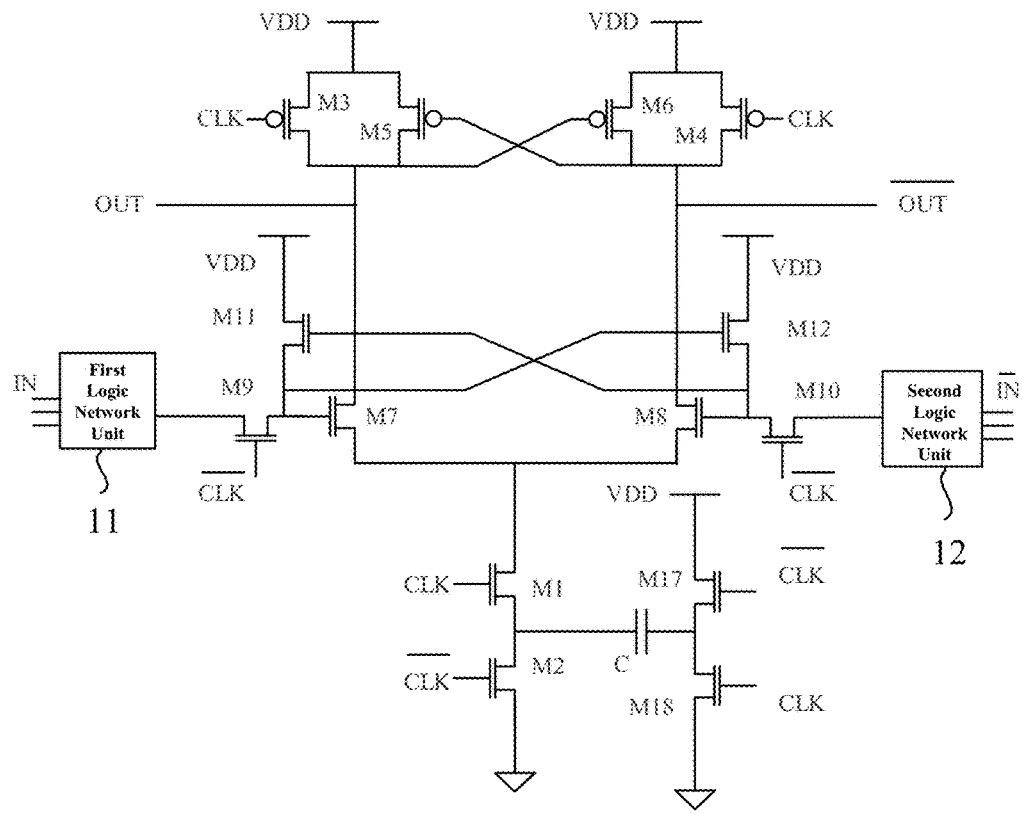
FIG. 4 is a schematic diagram of a circuit structure of a logic operation circuit in an embodiment of the present invention.

Referring to FIG. 4, a schematic circuit diagram of a logic operation circuit in accordance with a second embodiment is illustrated.

On the basis of FIG. 3, the differential amplification module 2 of this embodiment further includes a latch unit, a storage unit, and an absorption unit.

As shown in FIG. 4, a transistor M5 and a transistor M6 are P-channel MOSFETs, a first transistor M9, a second transistor M10, a third transistor M11, and a fourth transistor M12 are N-channel MOSFETs. The first transistor M9 and the second transistor M10 form the storage unit, and the third transistor M11 and the fourth transistor M12 form the absorption unit. The Transistor M5 and the transistor M6 form a latch. A gate terminal of the transistor M5 is connected to drain terminals of the transistor M4 and transistor M6, a source terminal of the transistor M5 is connected to the power supply voltage VDD, a drain terminal of the transistor M5 is connected to the drain terminal of transistor M3 and a gate terminal of the transistor M6, and a source terminal of the transistor M6 is connected to the power supply voltage VDD. The latch unit is used to control the differential voltage between the first output terminal OUT and the second output terminal $\overline{\text{OUT}}$ during an evaluation period. At this point, a gate terminal of the transistor M7 is connected to a source terminal of the transistor M9, a drain terminal of the transistor M7 is connected to the drain terminal of the transistor M5, the source terminal of the transistor M7 is connected to the drain terminal of the transistor M1. A gate of the transistor M8 is connected to a source terminal of the transistor M10, a drain terminal of the transistor M8 is connected to the drain terminal of transistor M6, and a drain terminal source is connected to the drain terminal of the transistor M1. Gate terminals of the first transistor M9 and the second transistor M10 are connected to the clock signal, a drain terminals connected to the output terminals of the first logic network unit 11 and the second logic network unit 12, and the source terminals of the first transistor M9 and the second transistor M10 connected to the gate terminals of the transistors M7 and M8, respectively. The first transistor M9 and the second transistor M10 control charges in the gate terminal of the transistor M7 and the transistor M8, achieving storing information in the gates terminals of the transistor M7 and the transistor M8. A gate terminal of the third transistor M11 is connected to a source terminal of the fourth transistor M12 and the source terminal of the second transistor M10, a drain terminal of the third transistor M11 connected to the power supply voltage VDD. A gate terminal of the fourth transistor M12 is connected to a source terminal of the third transistor M11 and a source terminal of the first transistor M9, a drain terminal of the fourth transistor M12 is connected to the power supply voltage VDD. The third transistor M11 and the fourth transistor M12 are respectively configured to absorb excess charges generated by the first transistor M9 and the second transistor M10 during switch switching. Using the third transistor M11 and the fourth transistor M12 to form the latch connection to optimize the charge injection effect of the first transistor M9 and the second transistor M10 channels. The channel charge injection refers to a phenomenon where the charges in the channel region flows into or out of the MOS switch at the moment when the MOS (metal oxide semiconductor) device is turned on or off, changing a voltage of a corresponding node and introducing errors. The optimization of channel charge injection effects in the first transistor M9 and the second transistor M10 can improve circuit speed and reduce circuit power consumption. The third transistor M11 and the fourth transistor M12 can be N-type transistors or P-type transistors. When the third transistor M11 and the fourth transistor M12 are P-type transistors, the gate terminal of the third transistor M11 is connected to the drain terminal of the fourth transistor M12, the source terminal of the third transistor M11 is connected to the power supply voltage, and the drain terminal of the third transistor M11 is connected to the gate of transistor M7. The gate terminal of the fourth transistor M12 is connected to the drain terminal of the third transistor M11, the source terminal of fourth transistor M12 is connected to the power supply voltage, and the drain of the fourth transistor M12 is connected to the gate of transistor M8.

The operation of the logic operation circuit in FIG. 4 is divided into a pre-charging period and an evaluation period. The process is as follows: during the pre-charging period, the clock signal CLK is at a low level, the clock signal is at a high level, the transistor M3 and the transistor M4 are conducting in the pre-charging unit, the first output terminal OUT and the second output terminal $\overline{OUT}$ output power voltage VDD, and the first transistor M9 and the second transistor M10 are conducting, the output results of the first logic network unit 11 and the second logic network unit 12 are stored at the gate terminals of transistor M7 and transistor M8, respectively. The third transistor M11 or the fourth transistor M12 conduct and absorb the excess charge generated by the switch of the first transistor M9 or the second transistor M10. At this point, the transistor M2 conducts, causing the charge on capacitor C to be released to ground GND. Meanwhile, the transistor M1 is turned off, and a current path between the power supply voltage VDD and ground GND is turned off. In the evaluation period, the clock signal CLK is at a high level and the clock signal is at a low level. In the pre-charging unit, the transistor M3 and the transistor M4, the first transistor M9, the second transistor M10, the third transistor M11, and the fourth transistor M12 are turned off. In the current source unit, the transistor M1 conducts, the capacitor C forms a virtual ground, the transistor M7 or the transistor M8 also conducts, and the first output terminal OUT and the second output terminal $\overline{OUT}$ to ground GND form a current path. Due to different impedances in the current paths of the first output terminal OUT and the second output terminal $\overline{OUT}$, there may be a situation that one output voltage drops faster than the other. At this point, the transistor M5 and the transistor M6 in the latch unit will help balance the circuit. When the output voltage drops to a certain extent, the transistor M5 or the transistor M6 will conduct to allow the output voltage to return to the power supply voltage VDD.

It can be understood that the logic operation circuit of this embodiment is divided into the pre-charging period and the evaluation period. The first transistor M9 and the second transistor M10 are configured to control the storage of information to the gate terminals of the transistors M7 and M8. In the evaluation period, the function of the third transistor M11 and the fourth transistor M12 is to eliminate the harmful effects of the channel charge injection in the first transistor M9 and the second transistor M10, and utilize the beneficial effects. Due to the elimination of the channel charge injection effect of the first transistor M9 by the third transistor M11, and the elimination of the channel charge injection effect of the second transistor M10 by the fourth transistor M12, the first transistor M9 and the second transistor M10 need to store one low level and the other high level. The benefits of the channel charge injection effect are retained at the gate terminals with low levels, the defect of channel charge injection effect is eliminated by the third transistor M11 or the fourth transistor M12, so the transconductance difference of the PDN network is retained, which affects the output result. The function of transistor M3 and the transistor M4 is to control the output level back to VDD during the pre-charging period. The function of the transistor M1 and the transistor M2 is to perform logical operations by flowing electrons from the capacitor C into the logic network module during the evaluation period. During the pre-charging period, the capacitor C is discharged to release electrons to the ground. The main function of the transistor M5 and the transistor M6 is to maintain the output state during the evaluation period. In addition, the first output terminal OUT and the second output terminal $\overline{OUT}$ of the logic operation circuit in this embodiment will not have full swing, resulting in lower circuit power consumption and wider applicability.

The transistors in FIG. 4 can be partially or entirely P-type or N-type transistors. In addition, the current source unit 21 is a charge pump or any circuit that can achieve charge transfer function. Due to the fact that the transistor M1, the transistor M2, and the capacitor C are configured to provide a charge transport pathway, the charge pump in the field of integrated circuits can achieve the same function. Therefore, the capacitor C itself can be replaced by MOS commonly used in the field of integrated circuits, or implemented using MIM (metal capacitors), or special processes can be used to implement capacitors inside the chip, or capacitors can be specifically placed on another chip, and connect to the current source unit 21 by through-holes or other bonding wires on the chip to replace the capacitor C. In order to achieve two input XOR gate transmission calculation, a new technical solution is proposed based on the above embodiments.

Figure 5:
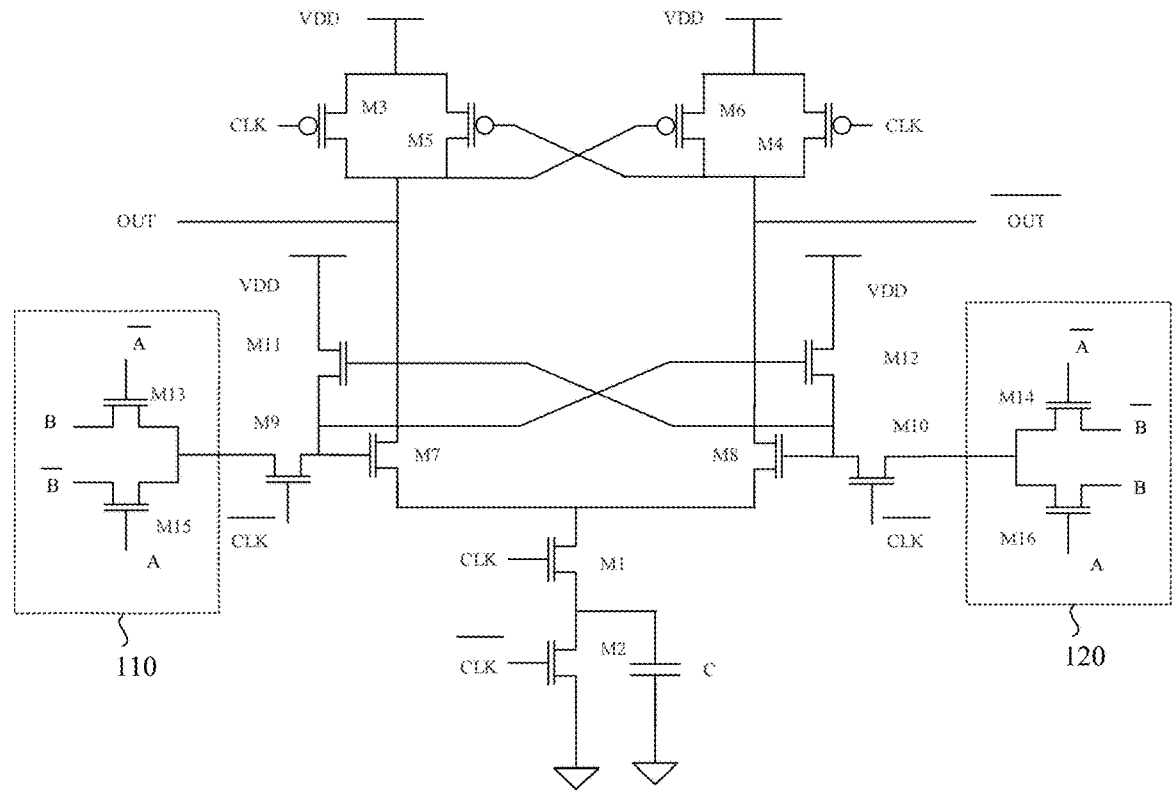
FIG. 5 shows a two input XOR gate transmission calculation circuit of an embodiment of the present invention.

Referring to FIG. 5, another embodiment of the present invention's two-input XOR gate transmission calculation circuit is shown.

The two-input XOR gate transmission calculation circuit of this embodiment is an instantiation formed by replacing the first logical network unit 11 and the second logical network unit 12 in FIG. 4 with the preset XOR logic function, which can complete the two input XOR function. In FIG. 5, the transistor M13 and the transistor M15 form the first XOR unit 110, the transistor M14 and the transistor M16 form the second XOR unit 120. The transistor M13, the transistor M14, the transistor M15, and the transistor M16 are all N-channel MOSFETs. A gate terminal of the transistor M13 is connected to the input signal, a drain terminal of the transistor M13 is connected to an input signal B, a source terminal of the transistor M13 is connected to the drain terminal of the first transistor M9, A gate terminal of the transistor M14 is connected to an input signal A, and a drain terminal of the transistor M14 is connected to an input signal $\overline{B}$, a source terminal of the transistor M14 is connected to the drain terminal of the first transistor M9, the gate terminal of the transistor M14 is connected to an input signal $\overline{A}$, the drain terminal of the transistor M14 is connected to the input signal $\overline{B}$, the source terminal of the transistor M14 is connected to the drain terminal of the second transistor M10, a gate terminal of the transistor M16 is connected to the input signal A, the drain terminal of the transistor M16 is connected to the input signal B, and the source terminal of the transistor M16 is connected to the drain terminal of the second transistor M10. The input signals A and B are the two input signals of the XOR gate. This embodiment can achieve the operation function of A XOR and B, and can store and complete the operation together. The logic operation circuit can preferably omit the first transistor M9 and the second transistor M10 to achieve a differential calculation circuit without storage function. It should be noted that by replacing the logical network module with any network capable of completing calculations, different logical calculation functions can be achieved.

The logic operation circuit of the above embodiment can achieve the calculation of logic functions and information storage, but when cascaded with other circuits, the range of driving voltage provided by the current source unit is narrow. In order to increase the range of driving voltage of the next level circuit when cascading logical operation circuits, the present invention provides a new technical solution.

Figure 6:
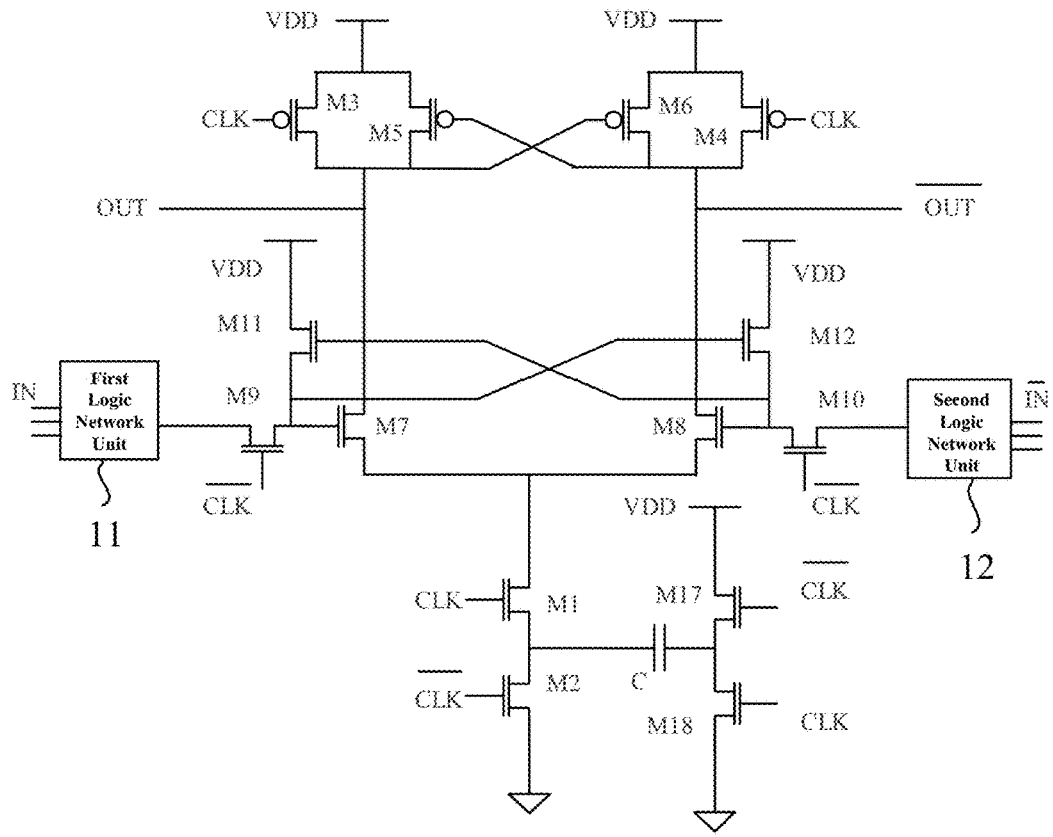
FIG. 6 shows a logic operation circuit with a switched capacitor unit in an embodiment of the present invention.

Referring to FIG. 6, another embodiment of the present invention's logic operation circuit with a switched capacitor unit is shown.

The differential amplification module in the logic operation circuit with a switched capacitor unit in this embodiment further includes at least one switched capacitor unit connected to the current source unit for increasing the range of output driving voltage. As shown in FIG. 6, the switch capacitor unit includes a transistor M17 and a transistor M18, which are N-channel transistors. At this point, one end of the capacitor C in the current source unit is connected to the drain terminal of the transistor M2, the other end of the capacitor C is connected to a drain terminal of the transistor M18, a gate terminal of the transistor M17 is connected to the clock signal, the drain terminal of the transistor M17 is connected to the power supply voltage VDD, a source terminal of the transistor M17 is connected to a drain terminal of the transistor M18, a gate terminal of the transistor M18 is connected to the clock signal CLK, and a source terminal of the transistor M18 is connected to ground GND. By adding switch capacitor units, a capacity of capacitor C can be reduced, an area of capacitor C can be reduced, and a range of driving voltage output from the source of transistor M1 can be wider.

The logic operation circuit of the above embodiments is only a separate circuit, and the logic functions implemented by the logic operation circuit are relatively simple. In order to achieve more complex circuit logic functions, a new technical solution is further proposed based on the above embodiments. The new technical solution can solve cascading problems of logic operation circuits, increase the complexity of the logic operation circuit, and meet the timing requirements between two logic operation circuits.

Figure 7:
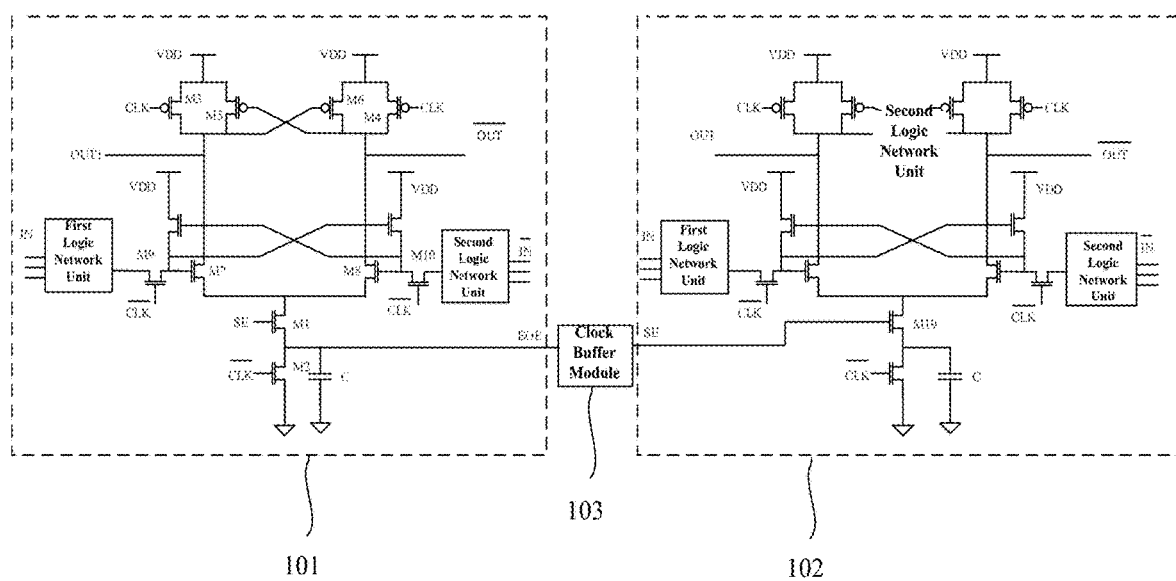
FIG. 7 is a circuit diagram of a cascaded differential logic operation circuit in an embodiment of the present invention.

Referring to FIG. 7, a circuit diagram of a cascaded differential logic operation circuit in another embodiment of the present invention is shown.

The logic operation circuit of this embodiment includes two or more differential logic operation circuits; in adjacent differential logic operation circuits, an output terminal of one differential logic operation circuit is connected to an input terminal of the other differential logic operation circuit to achieve cascading and increase the complexity of the circuit. Due to the high requirements for timing between logic circuits, in order to ensure that a timing sequence between cascaded logic operation circuits meets the requirements, the logic operation circuit in this embodiment further includes a clock buffer module connected between the differential logic operation circuits for controlling the timing sequential relationship between different differential logic operation circuits.

Specifically, as shown in FIG. 7, the logic operation circuit includes two differential logic operation circuits of a differential logic operation circuit 101 and a differential logic operation circuit 102. A first output terminal OUT and a second output terminal $\overline{OUT}$ of differential logic operation circuit 101 are respectively connected to the input terminal IN and $\overline{IN}$ corresponding to the differential logic operation circuit 102 to achieve cascading of the differential logic operation circuit 101 and the differential logic operation circuit 102. The logical network modules are connected based on the calculation relationship between the front and back stages of the logical network modules. According to timing requirements, they can be connected to the next stage through clock buffer module 103.

Figure 8:
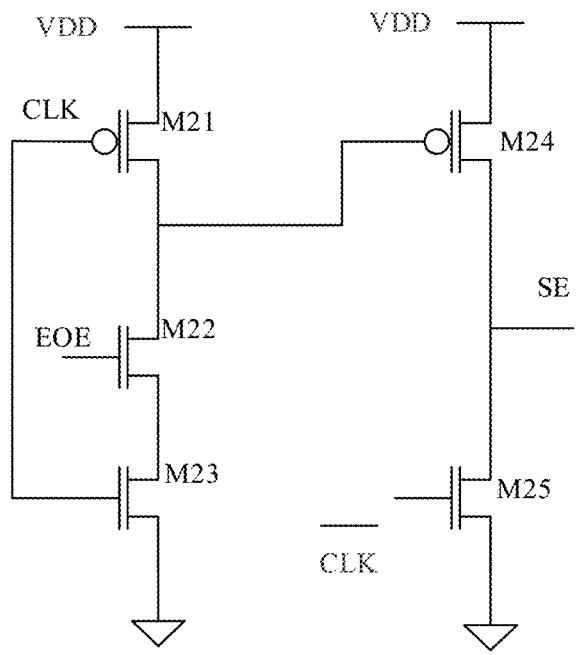
FIG. 8 is a circuit diagram of a clock buffer module in an embodiment of the present invention.

The clock buffer module 103 in FIG. 7 is shown in FIG. 8. A transistor M21, a transistor M24 are P-channel transistors, the transistor M22, the transistor M23, and the transistor M25 are all N-channel MOSFETs. A gate terminal of transistor M21 is connected to the clock signal CLK, a source terminal of transistor M21 is connected to the power supply voltage VDD, the drain terminal of transistor M21 is connected to a drain terminal of transistor M22, a gate of transistor M22 is connected to the signal EOE (evaluation end signal), and the source terminal of transistor M22 is connected to a drain terminal of transistor M23, The gate terminal of of the transistor M23 is connected to the clock signal CLK, the source terminal of the transistor M23 is grounded, a gate terminal of the transistor M24 is connected to the drain terminal of transistor M21, a source terminal of the transistor M24 is connected to the power supply voltage VDD, a drain terminal of the transistor M24 is connected to a drain terminal of the transistor M25, a gate terminal of the transistor M25 is connected to the clock signal, a source terminal of the transistor M25 is grounded, and the drain terminal of the transistor M25 outputs signal SE (starting evaluation), and is connected to the gate terminal of transistor M19 in the differential logic operation circuit 102. In the pre-charging period, a EOE node voltage of clock buffer module 103 is 0. At the beginning of the evaluation period, the capacitor C begins to charge, and the EOE node outputs a high level to drive the differential logic operation circuit 102.

A core technical point of a connection method of the differential logic operation circuit in FIG. 7 is to form the logic calculation module by N-type transistors. When the logic network module is used to calculation, using N-type transistors will improve the power consumption delay product, which is more advantageous than typical CMOS or complementary logic. In other embodiments, the logic network module may also use P-type transistors or transfer gate logic. The logical network module can be divided, arranged, and combined according to specific calculations to achieve various functions. It should be noted that CLK signals are required between the differential logic operation circuits in FIG. 7 to control the timing sequential relationship. A time of beginning evaluating and pre-charging is determined by an exact order of arrivals of the clock signals. If a phase difference between CLKs can ensure that the timing sequence meets the design requirements, the clock buffer module 103 in FIG. 7 can be omitted. If the differential logic operation circuit between the upper and lower stages needs close timing coordination and there is a close timing sequential relationship between the logics, the clock buffer module 103 in FIG. 8 needs to be used to meet the timing requirements. The differential logic operation circuits 101 can also be directly connected from the clock source to the differential logic operation circuit 102. In other optional implementations, the timing sequential relationship between different differential logic operation circuits can be controlled, and different phase-difference clocks can be connected between the differential logic operation circuit 101 and the differential logic operation circuit 102 to achieve correct timing sequence between the differential logic operation circuit 101 and the differential logic operation circuit 102. The differential logic operation circuit 101 and differential logic operation circuit 102 can cooperate with each other to produce correct calculation results, improved the accuracy of the calculation results.

The above embodiments can achieve cascading of logical operation circuits and improve the logical complexity of the circuit. The present invention provides an embodiment of implementing an adder using the above embodiments.

Figure 9:
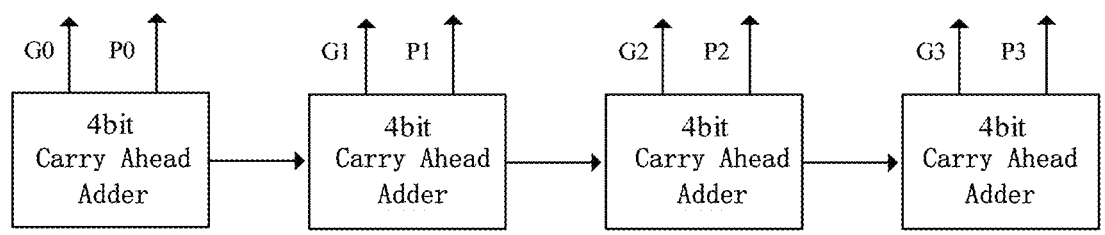
FIG. 9 is a schematic diagram of a structure of a 16 bit carry ahead adder assembly in an embodiment of the present invention.

Referring to FIG. 9, another embodiment of a 16 bit carry look ahead adder assembly of the present invention is shown.

The 16 bit carry ahead adder assembly in this embodiment consists of four sets of 4 bit carry ahead adders, which are implemented using the differential logic operation circuits. The logic network module of the 16 bit carry ahead adder assembly is determined by logics of a specific carry generation signal G and a specific carry transmission signal P. The specific calculation logic is:

$$G=G3+P3G2+P3P2G1+P3P2P1G0$$

Wherein, G0, G1, G2, and G3 are the carry generation signals of the 4-bit carry ahead adders from low to high, P0, P1, P2, and P3 are the carry transmission signals of the 4-bit carry ahead adders from low to high, respectively, and G is a bit generation signal of the 16 bit carry ahead adder assembly.

This embodiment can use a plurality of the differential logic operation circuits to implement an adder with more bits, but is not limited to the above examples.

Figure 10:
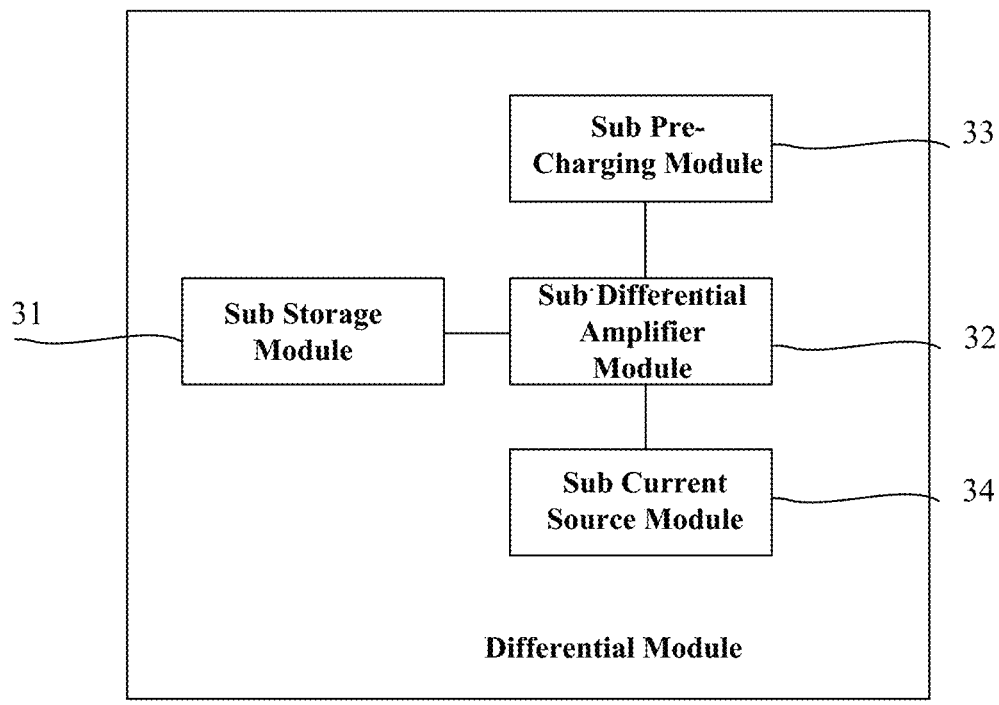
FIG. 10 is a schematic diagram of the structure of a differential amplification circuit in an embodiment of the present invention.

The present invention also provides a differential amplification circuit, which includes at least one differential module. The differential amplification circuit of this embodiment includes a differential module, as shown in FIG. 10. The differential module includes a sub storage module 31, a sub differential amplifier module 32, a sub pre-charged electronic module 33, and a sub current source module 34.

The sub storage module 31 includes a differential input terminal to store the input differential signal during the pre-charging period, and to input the differential signal to the sub differential amplifier module 32; the sub differential amplification module 32 includes a differential output terminal, connected to the sub storage module 31 to output the differential results based on the differential signal; the sub pre-charging electronic module 33 is connected to the sub differential amplifier module 32, to pre-charge the sub differential amplifier module to control a voltage of the differential output terminal to be the power supply voltage during the pre-charging period; the sub current source module 34 is connected to the sub differential amplifier module 32 to establish a current path for the differential amplifier unit during the evaluation period.

The differential amplification circuit of this embodiment can achieve information storage by adding a sub storage module 31. This differential module is connected to other circuit modules and can achieve differential transmission of signals, making changes of the physical data, such as, circuit power consumption, electromagnetic radiations, or temperatures, be not significant, and making it difficult to obtain data information inside the chip, preventing the side-channel attacks, and improving data security. In addition, as the functions of integrated circuits become increasingly complex and module integration increases, various complex logic functions can be achieved by adding storage functions to facilitate connection with other modules.

The differential amplification circuit of the above embodiment can achieve information storage. In order to further improve circuit speed and reduce circuit power consumption, the present invention provides a new technical solution to optimize the sub storage module 31.

Figure 11:
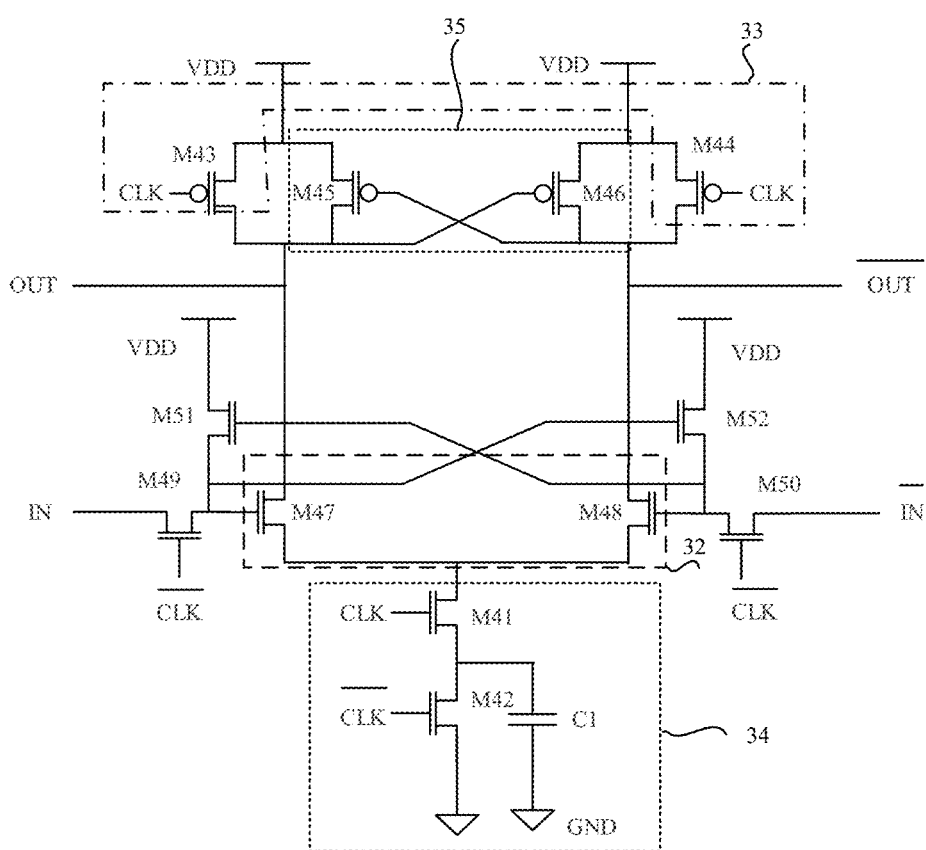
FIG. 11 is a schematic diagram of the circuit structure of a differential amplification circuit in an embodiment of the present invention.

Specifically, as shown in FIG. 11, the differential amplification circuit of this embodiment include a capacitor C1, a transistor M41, a transistor M42, a transistor M43, a transistor M44, a transistor M45, a transistor M46, a transistor M47, a transistor M48, a transistor M49, a transistor M50, a transistor M51, a transistor M52, a power supply voltage VDD, and ground GND. Wherein, the transistor M41, the transistor M42, the transistor M47, the transistor M48, the transistor M49, the transistor M50, the transistor M51, and the transistor M52 are N-channel MOS transistors, the transistor M43, the transistor M44, the transistor M45, and the transistor M46 are P-channel MOS transistors, the transistor M49 and the transistor M50 form a sub storage module. Gate terminals of the transistor M49 and the transistor M50 are connected to the clock signal $\overline{\text{CLK}}$ drain terminals of the transistor M49 and the transistor M50 are connected to the differential input signal IN and $\overline{\text{IN}}$, and source terminals of the transistor M49 and the transistor M50 are connected to gate terminals of the transistor M47 and the transistor M48, respectively. The transistors M49 and M50 control the charges stored in gate terminals of the transistors M47 and M48, enabling information to be stored in the gate terminals of transistors M47 and M48.

The transistor M47 and transistor M48 form the sub differential amplifier module 32, which is configured to amplify the input differential signal IN and $\overline{\text{IN}}$. A gate terminal of the transistor M47 is connected to the source of the transistor M49, a drain terminal of the transistor M47 is connected to the drain of the transistor M45, a source terminal of the transistor M47 is connected to a drain terminal of the transistor M41, a gate terminal of the transistor M48 is connected to a source terminal of the transistor M50, a drain terminal of the transistor M48 is connected to a drain terminal of a transistor M46, and a source terminal of the transistor M48 is connected to a drain terminal of the transistor M41. At the same time, the transistor M47 and the transistor M48 also form the PDN, which are used for transmitting and amplifying voltages of output nodes, respectively.

The transistor M43 and transistor M44 form a sub precharged module 33. The clock signal CLK is input to a gate terminal of the transistor M43, a source terminal of the transistor M43 is connected to the power supply voltage VDD, and a drain terminal is connected to the first output terminal OUT; the clock signal CLK is input to a gate terminal of the transistor M44. A source terminal of transistor M44 is connected to the power supply voltage VDD, and a drain terminal of the the transistor M44 is connected to the second output terminal. The pre-charging unit is configured to control the first output terminal OUT and the second output terminal to output the power supply voltage during the pre-charging period.

The transistor M41, the transistor M42, and the capacitor C1 form the sub current source module 34. A gate terminal of the transistor M41 is connected to the clock signal CLK, and a source terminal is connected to a drain terminal of the transistor M42 and one end of the capacitor C1. A gate terminal of the transistor M42 is connected to the clock signal $\overline{CLK}$, and the clock signal $\overline{CLK}$ forms the opposite signal to CLK. A source terminal of the transistor M42 and the other end of capacitor C1 are grounded to GND.

The transistor M45 and the transistor M46 form a sub latch module 35. A gate terminal of the transistor M45 is connected to drain terminals of the transistor M44 and transistor M46, a source terminal of the transistor M45 is connected to the power supply voltage VDD, a drain terminal of the transistor M45 is connected to the drain terminal of the transistor M43 and a gate of the transistor M46, and a source terminal of the transistor M46 is connected to the power supply voltage VDD. The sub latch module is configured to control the differential voltage between the first output terminal OUT and the second output terminal $\overline{OUT}$ during the evaluation period.

The operation of the differential amplification circuit in FIG. 11 is divided into the pre-charging period and the evaluation period. The principle and working process are similar to the differential logic operation circuit in FIG. 4, and will not be repeated here.

Figure 12:
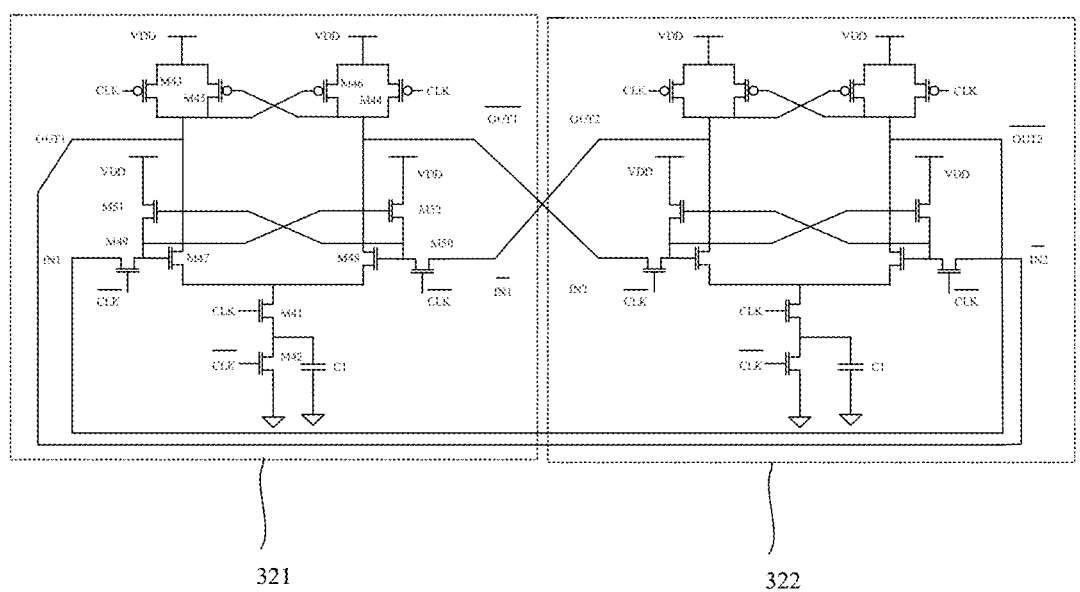
FIG. 12 is a circuit diagram of an embodiment of the present invention that utilizes a differential amplification circuit to generate a differential clock signal.

Referring to FIG. 12, a circuit diagram of another embodiment of the present invention that utilizes a differential amplification circuit to generate a differential clock signal.

The circuit diagram of this embodiment shows using a differential amplification circuit to generate a differential clock signal, the differential amplification circuit includes a first differential module 321 and a second differential module 322. The first input terminal IN1 of the first differential module 321 is connected to the second output terminal $\overline{OUT2}$ of the second differential module 322, the second input terminal $\overline{IN1}$ is connected to the first output terminal OUT2 of the second differential module 322, and the first output terminal OUT1 is connected to the second input terminal $\overline{IN1}$ of the second differential module 322, the second output terminal $\overline{OUT1}$ is connected to the first input terminal IN2 of the second differential module 322, which is used to implement a differential clock signal.

The present invention also provides a circuit for resisting side-channel attacks, including the aforementioned logic operation circuit. By using the above logic operation circuit, changes of the physical data, such as, circuit power consumption, electromagnetic radiations, or temperature are not significant, making it difficult to obtain internal data information of the chip, preventing side-channel attacks, and improving data security. In addition, the use of logic network modules can achieve various logic functions, improving the logical complexity of the circuit. Due to the fact that logic network modules can use lower power supply voltages, the power consumption of the circuit is reduced.

The present invention also provides an electronic device including the aforementioned logic operation circuit or differential amplification circuit, such as a mobile phone, a tablet computer, a power amplifier, etc. By using the aforementioned logic operation circuit or differential amplification circuit, the physical data such as circuit power consumption, electromagnetic radiation, or temperature changes are not obvious, making it difficult to obtain internal data information of the chip, preventing side-channel attacks, and improving data security. In addition, the use of logic network modules can achieve various logic functions, which can be used to achieve more complex logic operations. Due to the fact that logic network modules can be driven by lower voltage, circuit power consumption is reduced.

That is to say, the above is only an embodiment of the present application and does not limit the scope of the patent of the present application. Any equivalent structure or equivalent process transformation made using the description and drawings of the present application, such as the combination of technical features between various embodiments, or direct or indirect application in other related technical fields, are equally included in the scope of patent protection of the present application.

The invention claimed is:

1. A logic operation circuit, comprising:
   at least one differential logic operation circuit, comprising:
   a logic network module, comprising a first logic network unit and a second logic network unit with functions complementary to each other; a differential signal generated based on input signals of the first logic network unit and the second logic network unit, the first logic network unit and the second logic network unit performing a predetermined logic function to output an operation result based on the input signals; and
   a differential amplifier module, comprising a first input terminal, a second input terminal, a first output terminal, a second output terminal, the first input terminal and the second input terminal being connected to an output of the first logic network unit and the second logic network unit respectively; the first output terminal and the second output terminal forming a differential output terminal to amplify the operation result to obtain and output a logic operation result,
   wherein, the differential amplifier module comprises:
   a differential amplifier unit connected to an output terminal of the logical network module, and configured to amplify the operation result and output the logic operation result;
   a pre-charging unit connected to the differential amplifier unit, and configured to pre-charge the differential amplifier module for controlling a voltage of the differential output terminal to be a supply voltage in the pre-charging unit, and
   a current source unit, connected to the differential amplifier unit, and configured to establish a current path for the differential amplifier unit during an evaluation period;
   wherein, the differential amplifier module further comprises: a storage unit, connected with output terminals of the first logic network unit and the second logic network unit, and configured to store information;

wherein, the differential amplifier module further comprises: an absorbing unit connected to the storage unit, and configured to absorb excess electric charges generated by the storage unit when a switch is switched;

wherein, the current source unit comprises a transistor M1, a transistor M2, and a capacitor C, the transistor M1 and the transistor M2 are N-channel MOSFETs, with a gate terminal of the transistor M1 connected to a clock signal CLK, a source terminal connected to a drain terminal of the transistor M2 and one end of capacitor C, a gate terminal of the transistor M2 connected to a clock signal $\overline{CLK}$, and the phase of the clock signal $\overline{CLK}$ is opposite to that of clock signal CLK, a source terminal of the transistor M2 is grounded.

2. The logic operation circuit of claim 1, wherein the storage unit further comprises:

a first transistor, and a second transistor;

gate terminals of the first transistor and the second transistor are connected with a clock signal, drain terminals of the first transistor and the second transistor are respectively connected with the output terminals of the first logical network unit and the second logical network unit, and source terminals of the first transistor and the second transistor are respectively connected with the first input terminal and the second input terminal.

3. The logic operation circuit of claim 1, wherein the absorbing unit comprises a third transistor and a fourth transistor, when the third transistor and the fourth transistor are N-channel type transistors, a gate terminal of the third transistor is connected with a source terminal of the fourth transistor, a drain terminal of the third transistor is connected with a power supply voltage, a source terminal of the third transistor is connected with the first input terminal, a gate terminal of the fourth transistor is connected with the source terminal of the third transistor, a drain terminal of the fourth transistor is connected with the power supply voltage, a source terminal of the fourth transistor is connected with the second input terminal;

when the third transistor and the fourth transistor are P-channel type transistors, the gate terminal of the third transistor is connected with the drain terminal of the fourth transistor, the source terminal the third transistor is connected with the power supply voltage, and the drain the third transistor is connected with the first input terminal; the gate terminal of the fourth transistor is connected with the drain terminal of the third transistor, the source terminal is connected with the power supply voltage, and the drain terminal of the fourth transistor is connected with the second input terminal.

4. The logic operation circuit of claim 1, wherein the differential amplifier module further comprises at least one switch capacitance unit connected with the current source unit, and configured to broaden output drive voltage range.

5. An electronic device, comprising a logic operation circuit, the logic operation circuit comprising:

at least one differential logic operation circuit, comprising:

a logic network module, comprising a first logic network unit and a second logic network unit with functions complementary to each other; a differential signal generated based on input signals of the first logic network unit and the second logic network unit, the first logic network unit and the second logic network unit performing a predetermined logic function to output an operation result based on the input signals; and a differential amplifier module, comprising a first input terminal, a second input terminal, a first output terminal, and a second output terminal, the first input terminal and the second input terminal being connected to an output of the first logic network unit and the second logic network unit respectively; the first output terminal and the second output terminal forming a differential output terminal to amplify the operation result to obtain and output a logic operation result;

wherein, the differential amplifier module comprises:

a differential amplifier unit connected to an output terminal of the logical network module, and configured to amplify the operation result and output the logic operation result;

a pre-charging unit connected to the differential amplifier unit, and configured to pre-charge the differential amplifier module for controlling a voltage of the differential output terminal to be a supply voltage in a pre-charging unit, and a current source unit, connected to the differential amplifier unit, and configured to establish a current path for the differential amplifier unit during an evaluation period;

wherein, the differential amplifier module further comprises a storage unit, connected with output terminals of the first logic network unit and a second logic network unit, and configured to store information;

wherein, the differential amplifier module further comprises an absorbing unit connected to the storage unit, and configured to absorb excess electric charges generated by the storage unit when switching;

wherein, the current source unit comprises a transistor M1, a transistor M2, and a capacitor C, the transistor M1 and the transistor M2 are N-channel MOSFETs, with a gate terminal of the transistor M1 connected to a clock signal CLK, a source terminal connected to a drain terminal of the transistor M2 and one end of capacitor C, a gate terminal of the transistor M2 connected to a clock signal $\overline{CLK}$, and the phase of the clock signal $\overline{CLK}$ is opposite to that of clock signal CLK, a source terminal of the transistor M2 is grounded.

6. The electronic device of claim 5, wherein the storage unit further comprises a first transistor, and a second transistor, gate terminal of the first transistor and the second transistor are connected with a clock signal, a drain terminal of the first transistor and the second transistor are respectively connected with the output terminals of the first logical network unit and the second logical network unit, and a source terminal of the first transistor and the second transistor are respectively connected with the first input terminal and the second input terminal.

7. The electronic device of claim 5, wherein the absorbing unit comprises a third transistor and a fourth transistor, when the third transistor and the fourth transistor are N-channel type transistors, a gate terminal of the third transistor is connected with a source terminal of the fourth transistor, a drain terminal of the third transistor is connected with the power supply voltage, the source terminal is connected with the first input end, a gate terminal of the fourth transistor is connected with the source terminal of the third transistor, the drain terminal of the fourth transistor is connected with a power supply voltage, a source terminal of the fourth transistor is connected with the second input terminal; when the third transistor and the fourth transistor are P-channel type transistors, a gate terminal of the third transistor is connected with a drain terminal of the fourth transistor, the source terminal the third transistor is connected with the power supply voltage, and the drain the third transistor is connected with the first input terminal; a gate terminal of the fourth transistor is connected with a drain terminal of the third transistor, the source terminal is connected with the power supply voltage, and a drain terminal of the fourth transistor is connected with the second input terminal.

8. The electronic device of claim 5, wherein the differential amplifier module further comprises at least one switch capacitance unit connected with the current source unit, and configured to add output drive voltage range.

9. The electronic device of claim 5, further comprising a differential amplifier circuit, comprising at least one differential module, the at least one differential module comprising:
- a sub storage module with a differential input terminal, configured to receive and store input differential signals;
- a sub differential amplifier module with a differential output terminal connected with the sub storage module, and configured to output differential results based on the input differential signals;
- a sub pre-charging unit, connected to the sub differential amplifier module, and configured to pre-charge the sub differential amplifier module for controlling a voltage of the differential output terminal to be a supply voltage during a pre-charging period, and
- a sub current source unit, connected to the sub differential amplifier module, and configured to establish a current path for the sub differential amplifier module during an evaluation period.

10. The logic operation circuit of claim 4, wherein the switch capacitor unit includes a transistor M17 and a transistor M18, which are N-channel transistors; the other end of the capacitor C is connected to a drain terminal of the transistor M18, a gate terminal of the transistor M17 is connected to the clock signal $\overline{CLK}$, a drain terminal of the transistor M17 is connected to the power supply voltage, a source terminal of the transistor M17 is connected to a drain terminal of the transistor M18, a gate terminal of the transistor M18 is connected to the clock signal CLK.

11. The electronic device of claim 8, wherein the switch capacitor unit includes a transistor M17 and a transistor M18, which are N-channel transistors; the other end of the capacitor C is connected to a drain terminal of the transistor M18, a gate terminal of the transistor M17 is connected to the clock signal $\overline{CLK}$, a drain terminal of the transistor M17 is connected to the power supply voltage, a source terminal of the transistor M17 is connected to a drain terminal of the transistor M18, a gate terminal of the transistor M18 is connected to the clock signal CLK.

\* \* \* \* \*